(12) United States Patent
Zuniga-Ortiz et al.

(10) Patent No.: US 8,648,430 B2
(45) Date of Patent: Feb. 11, 2014

(54) MICROELECTROMECHANICAL SYSTEM HAVING MOVABLE ELEMENT INTEGRATED INTO SUBSTRATE-BASED PACKAGE

(71) Applicant: Texas Instruments Incorporated, Dallas, TX (US)

(72) Inventors: Edgar R. Zuniga-Ortiz, McKinney, TX (US); William R. Krenik, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/670,242

(22) Filed: Nov. 6, 2012

(65) Prior Publication Data

US 2013/0062711 A1    Mar. 14, 2013

Related U.S. Application Data

(63) Continuation of application No. 12/701,683, filed on Feb. 8, 2010, now Pat. No. 8,304,274.

(60) Provisional application No. 61/291,767, filed on Dec. 31, 2009, provisional application No. 61/152,607, filed on Feb. 13, 2009.

(51) Int. Cl.
*H01L 29/84* (2006.01)

(52) U.S. Cl.
USPC ............................... 257/415; 438/50; 438/51

(58) Field of Classification Search
USPC ....................................... 257/415; 438/50, 51
See application file for complete search history.

(56) References Cited

U.S. PATENT DOCUMENTS

| | | | | |
|---|---|---|---|---|
| 4,021,766 A * | 5/1977 | Aine | ................................. | 338/2 |
| 4,965,415 A * | 10/1990 | Young et al. | ................ | 200/83 N |
| 5,479,042 A * | 12/1995 | James et al. | .................. | 257/415 |
| 5,856,914 A * | 1/1999 | O'Boyle | ........................ | 361/761 |
| 5,966,066 A * | 10/1999 | Mehregany et al. | ............ | 337/70 |
| 6,465,854 B1 * | 10/2002 | Muenzel et al. | ............... | 257/417 |
| 6,538,799 B2 * | 3/2003 | McClelland et al. | ......... | 359/291 |
| 6,809,412 B1 * | 10/2004 | Tourino et al. | ................ | 257/678 |
| 6,933,164 B2 * | 8/2005 | Kubena | ........................... | 438/49 |
| 6,961,182 B2 * | 11/2005 | Murata | .......................... | 359/578 |
| 7,022,542 B2 * | 4/2006 | Combi et al. | .................... | 438/52 |
| 7,056,758 B2 * | 6/2006 | Segal et al. | ...................... | 438/50 |
| 7,368,808 B2 * | 5/2008 | Heck et al. | ..................... | 257/678 |
| 7,381,663 B2 * | 6/2008 | Sato et al. | ....................... | 438/48 |
| 7,456,497 B2 * | 11/2008 | Higashi | ........................ | 257/704 |
| 7,926,354 B2 * | 4/2011 | Sato | ............................... | 73/754 |

(Continued)

*Primary Examiner* — Jae Lee
*Assistant Examiner* — Grant Withers
(74) *Attorney, Agent, or Firm* — Warren L. Franz; Wade J. Brady, III; Frederick J. Telecky, Jr.

(57) ABSTRACT

A semiconductor-centered MEMS device (100) integrates the movable microelectromechanical parts, such as mechanical elements, flexible membranes, and sensors, with the low-cost device package, and leaving only the electronics and signal-processing parts in the integrated circuitry of the semiconductor chip. The package is substrate-based and has an opening through the thickness of the substrate. Substrate materials include polymer tapes with attached metal foil, and polymer-based and ceramic-based multi-metal-layer dielectric composites with attached metal foil. The movable part is formed from the metal foil attached to a substrate surface and extends at least partially across the opening. The chip is flip-assembled to span at least partially across the membrane, and is separated from the membrane by a gap.

16 Claims, 7 Drawing Sheets

(56) References Cited

U.S. PATENT DOCUMENTS

| | | | |
|---|---|---|---|
| 7,954,215 B2* | 6/2011 | Saito | 29/25.35 |
| 8,008,739 B2* | 8/2011 | Ishii | 257/417 |
| 8,198,689 B2* | 6/2012 | Chan et al. | 257/415 |
| 8,338,208 B2 | 12/2012 | Zuniga-Ortiz et al. | |
| 2001/0022382 A1* | 9/2001 | Shook | 257/415 |
| 2003/0067047 A1* | 4/2003 | Sandoe et al. | 257/415 |
| 2003/0104649 A1* | 6/2003 | Ozgur et al. | 438/50 |
| 2003/0222321 A1* | 12/2003 | Yang et al. | 257/415 |
| 2004/0238907 A1* | 12/2004 | Pinkerton et al. | 257/419 |
| 2005/0067666 A1* | 3/2005 | Robert | 257/415 |
| 2005/0167795 A1* | 8/2005 | Higashi | 257/678 |
| 2005/0263760 A1* | 12/2005 | Langer et al. | 257/48 |
| 2005/0263836 A1* | 12/2005 | Okada et al. | 257/415 |
| 2006/0141658 A1* | 6/2006 | Bar-Sadeh et al. | 438/50 |
| 2007/0275494 A1* | 11/2007 | Mayer et al. | 438/50 |
| 2008/0048278 A1* | 2/2008 | Hishinuma et al. | 257/415 |
| 2008/0093689 A1* | 4/2008 | Thomas | 257/415 |
| 2009/0108381 A1* | 4/2009 | Buchwalter et al. | 257/415 |
| 2009/0174014 A1* | 7/2009 | Kunze et al. | 257/415 |
| 2009/0215213 A1* | 8/2009 | Chou | 438/48 |
| 2010/0065930 A1* | 3/2010 | Nakatani | 257/415 |
| 2010/0090297 A1* | 4/2010 | Nakatani | 257/415 |
| 2010/0207216 A1* | 8/2010 | Drews et al. | 257/415 |
| 2010/0207217 A1* | 8/2010 | Zuniga-Ortiz et al. | 257/415 |
| 2010/0237447 A1 | 9/2010 | Laming et al. | |
| 2011/0095384 A1* | 4/2011 | Nunan et al. | 257/415 |
| 2011/0108933 A1* | 5/2011 | Nakatani | 257/415 |
| 2011/0156178 A1* | 6/2011 | Zuniga-Ortiz et al. | 257/415 |
| 2011/0241137 A1* | 10/2011 | Huang et al. | 257/419 |
| 2011/0249834 A1* | 10/2011 | Takaoka | 381/191 |
| 2012/0175715 A1* | 7/2012 | Hammond et al. | 257/415 |
| 2013/0062711 A1* | 3/2013 | Zuniga-Ortiz et al. | 257/415 |
| 2013/0099333 A1* | 4/2013 | Zuniga-Ortiz et al. | 257/418 |

* cited by examiner

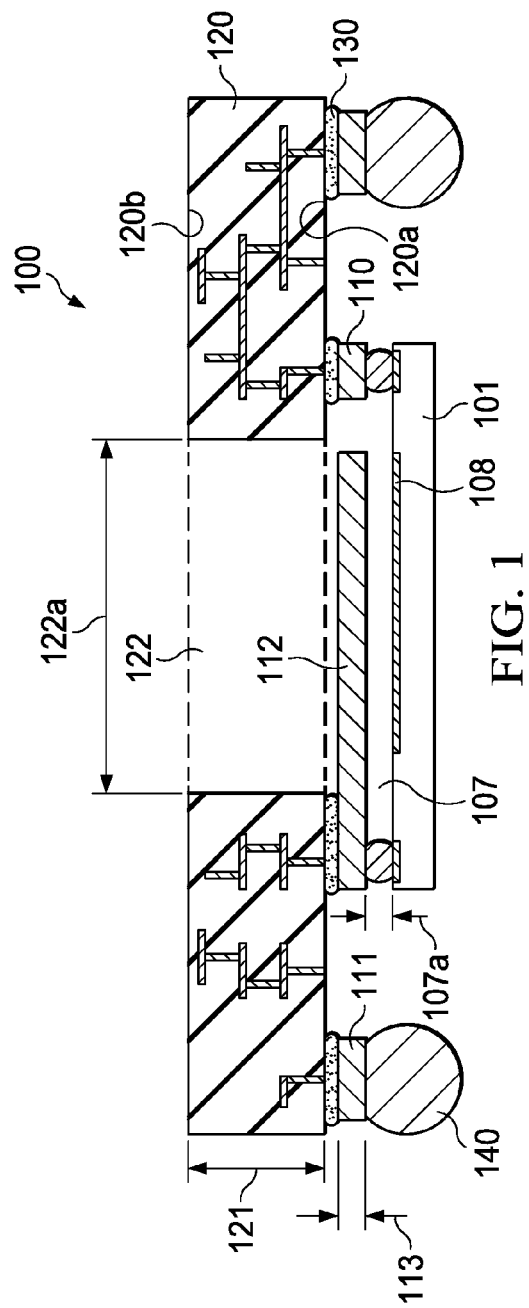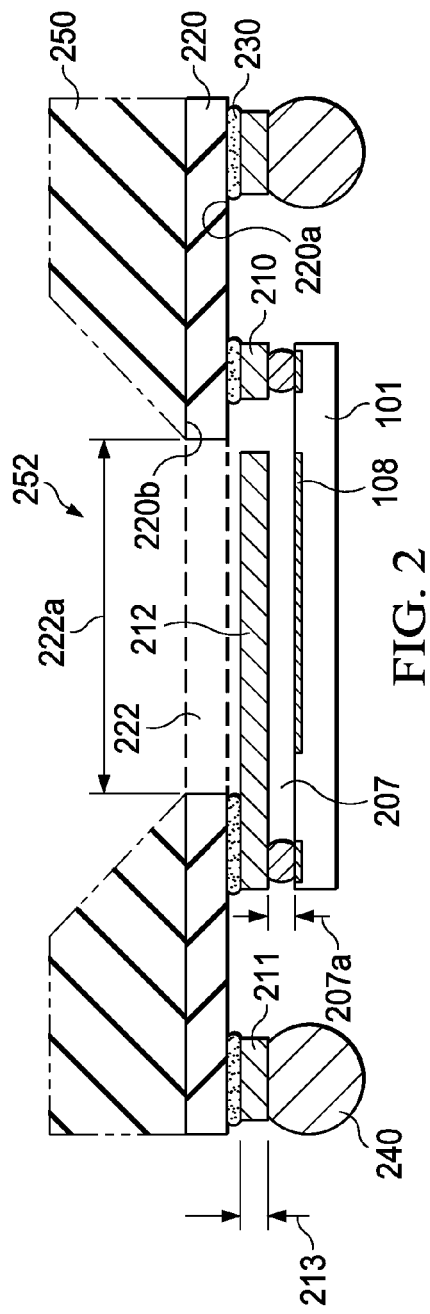

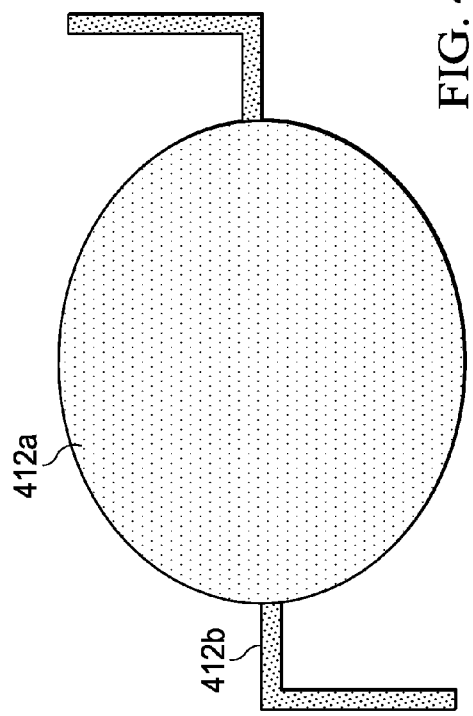
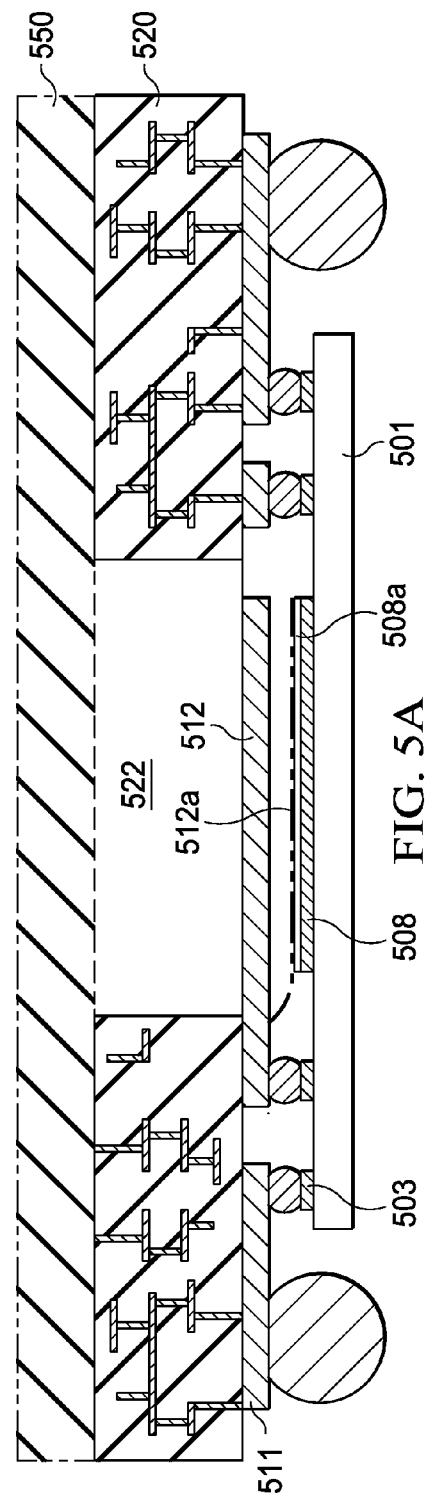

MICROELECTROMECHANICAL SYSTEM HAVING MOVABLE ELEMENT INTEGRATED INTO SUBSTRATE-BASED PACKAGE

CROSS-REFERENCE TO RELATED APPLICATIONS

This application is a continuation of application Ser. No. 12/701,683 filed Feb. 8, 2010 (now U.S. Pat. No. 8,304,274), the entirety of which is incorporated by reference herein, which claims the benefit of Provisional Application Nos. 61/291,767 filed Dec. 31, 2009, and 61/152,607 filed Feb. 13, 2009.

FIELD OF THE INVENTION

This relates in general to the field of semiconductor devices and processes, and more specifically to the structure and fabrication of microelectromechanical system (MEMS) devices having a movable element integrated into a substrate-based ball grid array package and a sensing element built on an integrated circuit.

DESCRIPTION OF RELATED ART

The wide variety of products collectively called microelectromechanical system (MEMS) devices are small, low weight devices on the micrometer to millimeter scale produced on the basis of batch fabrication techniques similar to those used for semiconductor microelectronics devices. MEMS devices integrate mechanical elements, sensors, actuators, and electronics on a common carrier. MEMS devices have been developed to sense mechanical, thermal, chemical, radiant, magnetic, and biological quantities and inputs, and produce signals as outputs.

MEMS devices may have parts moving mechanically under the influence of an energy flow (acoustic, thermal, or optical), a temperature or voltage difference, or an external force or torque. Certain MEMS devices with a membrane, plate or beam can be used as a pressure sensor or actuator (for instance microphone and speaker), inertial sensor (for instance accelerometer), or capacitive sensor (for instance strain gauge and RF switch); other MEMS devices operate as movement sensors for displacement or tilt; bimetal membranes work as temperature sensors. Besides small size, the general requirements for the membrane- or plate-operated sensors include long term stability, small temperature sensitivity, low hysteresis for pressure and temperature, resistance to corrosive environments, and often hermeticity.

In a MEMS device, the mechanically moving parts are fabricated together with the sensors and actuators in the process flow of the electronic integrated circuit (IC) on a semiconductor chip. As an example, the mechanically moving parts may be produced by an undercutting etch at some step during the IC fabrication. Bulk micromachining processes employed in MEMS device sensor production for creating, in bulk semiconductor crystals, the movable elements and the cavities for their movements include anisotropic wet etching, reactive ion etching (RIE), and deep reactive ion etching (DRIE). These techniques employ photolithographic masking, are dependent on crystalline orientation, and need etch stops, all of which are expensive in terms of time and throughput. In addition, there are bulk and surface micromachining techniques for building up structures in thin films on the surface of semiconductor wafers, also expensive techniques. While many of the processes are expensive to implement, some processes, such as automatic wafer bonding, are inexpensive.

Because of the moving and sensitive parts, MEMS devices have a need for physical and atmospheric protection. Consequently, MEMS devices are surrounded by a housing or package, which has to shield the MEMS device against ambient and electrical disturbances, and against stress. For many devices, fully hermetic and even quasi-hermetic packages represent a significant cost adder, especially when ceramic packages or precision parts such as glass plates are required.

Among the basic operating principles of pressure sensors are piezoresistive, capacitive, and resonant operation. In the piezoresistive operation, the pressure is converted to an electronically detectable signal, wherein the conversion relies on the elastic deformation of a structure such as a membrane exposed to the pressure; pressure causes strain, and strain causes change of electrical resistivity. In MEMS device silicon technology, controlling the membrane thickness, size, and alignment involves precision process steps. In the resonant operation, the pressure causes mechanical stress in the vibrating microstructure; the resonance frequency is measured in dependence on the mechanical stress. Excitation and damping of the MEMS device silicon diaphragm and the nonlinear frequency-pressure relationship require sophisticated calibration. In the capacitive operation, the pressure causes a displacement-dependent output signal. The change in pressure causes a displacement, the displacement causes a capacitor change, and the capacitor change causes an electrical signal similar to the operation of a condenser microphone. Nonlinearity and parasitic capacitances and residual membrane stress represent challenges for MEMS device membrane fabrication of silicon and epitaxial silicon.

Taking the example of capacitive pressure sensors, several fabrication methods may be chosen. In one method, the sensors are bulk micro-machined as a glass-silicon-glass structure with vertical feed-throughs. In another method, a preferentially etched wafer receives deep and shallow boron diffusions and dielectric depositions, which are mounted on glass so that the wafer can finally be dissolved. In yet another method, a surface micro-machined capacitive pressure sensor is created by a polysilicon layer (1.5 µm thick) separated by a gap (0.8 µm wide) over the n+ doped silicon electrode; the sensor is monolithically integrated with the sensing circuitry. The sensors are small and span an operating range from about 1 bar to 350 bar, have high overpressure stability, low temperature dependence and low power consumption.

In the basic operating principle of accelerometers, the mechanical and electrical sensitivity are a function of the vertical displacement of the movable plate's center. In displacement sensing accelerometers, the applied acceleration as input is transformed into the displacement of the movable mass (plate) as output; a suspension beam serves as the elastic spring. Force sensing accelerometers detect directly the force applied on a proof mass. The MEMS device fabrication in bulk single-crystal silicon of the movable plate, the suspension beam, and the proof mass requires sensitive semiconductor etching techniques.

SUMMARY

Applicants believe manufacturing cost is the dominant factor preventing the widespread integration of pressure sensors, microphones, accelerometers and other applications in which a movable member is needed to convert an external analog input into an electrical output, into systems in the automotive, medical, and aerospace industries.

Applicants saw that building a MEMS device on the surface or within the wafer by standard wafer fab technology and standard wafer fab lithographic methods is not only a high cost approach, but also limits the choice of materials and configuration available for the MEMS device components, which have to be compatible with the standard wafer process. After the wafer fabrication, in standard technology, the MEMS devices still have to be packaged using known packaging material and processes—another cost adder.

Applicants solved the problem of mass-producing low cost semiconductor-centered MEMS devices by integrating the movable MEMS device parts, such as mechanical elements and sensors, including their complete fabrication with low-cost device materials and packages, and by leaving only the electronics and signal-processing parts in the integrated circuitry. The package, into which the movable parts are integrated, may either be a leadframe-based or a substrate-based plastic molded housing. With this invention, the MEMS devices may use a standard CMOS chip without any movable structure and a packaging component with movable structures built therein.

Applicants further discovered that the separation of movable and electronics parts provides greater system level integration with other components such as package-on-package MEMS devices, thus increasing the electrical product efficiency.

In embodiments, which have the movable elements integrated into a substrate-based package, the substrate may be a stiff multi-layer substrate, such a multi-metal-layer FR-4 board, or a flexible film substrate, such as a metalized polyimide tape. The latter devices need a molded encapsulation for robustness. Packages can be stacked with solder bodies as connecting elements.

Embodiments of this invention include the usage of electrostatic force, acceleration, air pressure, etc., to deflect a beam or membrane for building microphones, pressure sensors, accelerometers, and other applications where a movable member is needed to convert an external input into an electrical output.

Example MEMS devices of the pressure sensor family, operating on capacitive changes caused by a movable membrane, may offer 80% lower fabrication cost, when the membrane is integrated into the plastic device package instead of being fabricated in conventional manner as a portion of the silicon chip.

One embodiment of the present invention provides a MEMS device comprising: a flat substrate having a thickness, a first surface and an opposite second surface; an opening through the thickness of the substrate, the opening extending from the first to the second surface; a metal foil attached onto the first surface of the substrate, the foil including a plurality of pads and a membrane extending at least partially across the opening; and an integrated circuit chip flip-assembled to the pads, the chip at least partially spanning across the opening, separated from the membrane by a gap.

Another embodiment of the present invention provides a method for fabricating a MEMS device comprising the steps of: forming an opening from a first surface to an opposite second surface of a flat substrate; laminating a metal foil onto the first substrate surface and at least partially across the opening so that the foil adheres to the substrate; patterning the metal layer into a plurality of pads and a segment; and flip-connecting a semiconductor chip having electronic circuitry onto the pads so that the chip spans across at least partially across the opening, separated from the segment by a gap.

BRIEF DESCRIPTION OF THE DRAWINGS

FIG. 1 illustrates a schematic cross section of an example MEMS device of the inertial sensor family operating as a capacitive accelerometer, where the movable membrane is part of the substrate-based package. In the example shown, the substrate is a multi-metal layer insulating composite, and all pads and the membrane are on one surface of the composite in the same plane.

FIG. 2 shows a schematic cross section of an example MEMS device of the inertial sensor family operating as a capacitive accelerometer, where the movable membrane is part of the substrate-based package. In the example shown, the substrate is an insulating tape and the metal pads and the membrane are on one surface of the tape in the same plane; an encapsulation may be added to enhance the package robustness.

FIG. 4B shows a top view of an example outline of the membrane in FIG. 4A.

FIG. 5A depicts a schematic cross section of another example MEMS device of the inertial sensor family operating as a capacitive accelerometer, where the movable membrane is part of the substrate-based package.

FIG. 9A is a schematic cross section of the dielectric substrate with openings formed form the first to the second substrate surface.

FIG. 9B is a schematic cross section of the substrate after depositing a layer of adhesive material on the first surface of the carrier.

FIG. 9C is a schematic cross section of the substrate after laminating a metal foil across the adhesive layer.

FIG. 9D is a schematic cross section of the substrate after depositing a photoresist layer across the metal foil and another photoresist layer across the contoured second substrate surface.

FIG. 9E is a schematic cross section of the substrate after patterning the metal foil and removing both photoresist layers.

FIG. 9F is a schematic cross section of the substrate after the process step of flip-connecting semiconductor chips.

FIG. 9G is a schematic cross section of the assembled substrate after attaching solder balls for external connection.

FIG. 9H shows a schematic cross section of singulated completed inertial sensor MEMS device with the movable membrane integrated into the substrate-based package.

FIG. 9I is a schematic cross section of the assembled substrate after depositing an encapsulation compound.

FIG. 9J shows a schematic cross section of singulated completed inertial sensor MEMS device with the movable membrane integrated into the substrate-based package strengthened by encapsulation compound.

DETAILED DESCRIPTION OF EXAMPLE EMBODIMENTS

Figure 3:
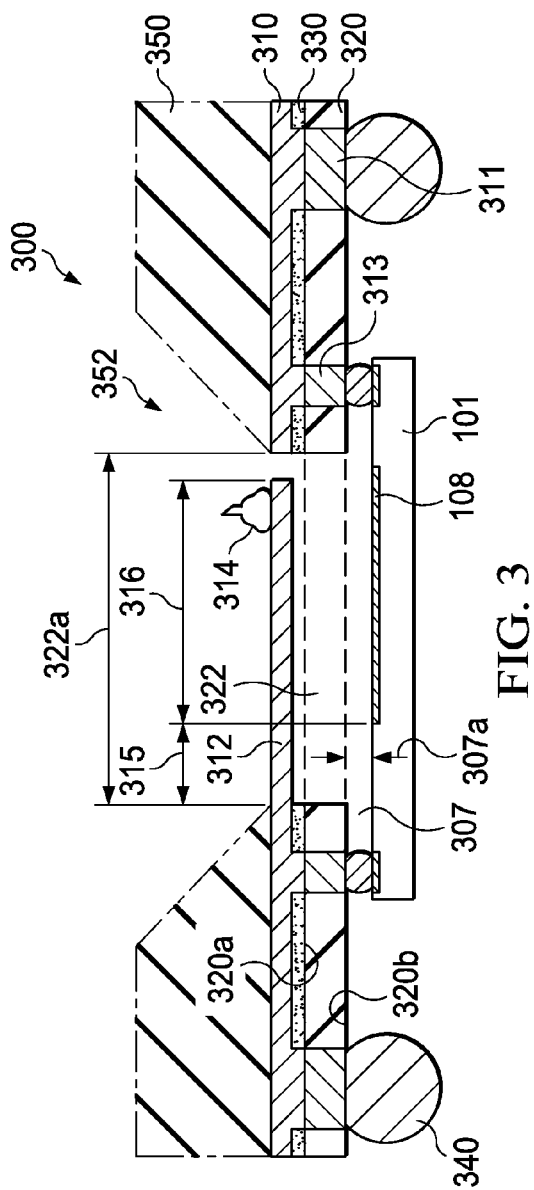
FIG. 3 shows a schematic cross section of an example MEMS device of the inertial sensor family operating as a capacitive accelerometer, where the movable membrane is part of the substrate-based package. In the example shown, the substrate is an insulating tape, the membrane and some pads are on one surface of the tape, other pads on the opposite surface; an encapsulation may be added to enhance the package robustness.

FIG. 1 illustrates a schematic cross section of an example embodiment of the invention showing a microelectromechanical system (MEMS) device of the inertial sensor family, which operates as a capacitive accelerometer with displacement-dependent output signals. In these sensors, acceleration is transformed into the displacement of a movable mass or plate; the position change is measured as a change of the capacitance relative to a fixed plate. Capacitive accelerometers exhibit high sensitivity, good DC response and noise performance, low drift, and low power dissipation and temperature sensitivity. The example MEMS device, generally designated 100 in FIG. 1, is a system structured like QFN (Quad Flat No-lead) and SON (Small Outline No-Lead) type semiconductor devices.

In the embodiment of FIG. 1, an integrated circuit device, represented by chip 101, is flip-assembled on metallic pads 110. Flip-assembly typically utilizes conductive spacers such as solder balls or solder bodies to mechanically and electrically attach a chip surface, on which an integrated circuit has been formed, to an opposing surface of a substrate which interconnects multiple integrated circuits or other electrical components. Metallic pads 110, which are attached to the first surface 120a of a substrate 120. This substrate is flat, has a thickness 121, a first surface 120a and an opposite second surface 120b. Substrate 120 is made of insulating material, which may be a polymeric compound, in some devices strengthened by glass fibers, or a ceramic compound, or a glass compound. As examples, substrate 120 may be a sheet or board made of a multi-metal layer composite, as schematically indicated in FIG. 1, or it may be a sheet-like multi-metal layer ceramic composite. The typical thickness range is between about 70 and 150 µm. Alternatively, the substrate may be a flexible polymeric tape such as polyimide (as indicated by designation 220 in FIG. 2).

MEMS device 100 has an opening 122 through the thickness 121 of substrate 120. In FIG. 1, the opening has a uniform width 122a; in other embodiments, the width of the opening may not be constant. Openings 122 may be shaped as a cylinder, a truncated cone, or any other suitable stereometrical form. As FIG. 1 shows, opening 122 extends from the first substrate surface 120a to the second substrate surface 120b. Flip-assembled chip 101 spans at least partially across the opening.

As FIG. 1 illustrates, metallic pad 110 is a portion of a patterned metal foil attached onto the first surface 120a of substrate 120; an adhesive layer 130 may be used for the attachment (the processes for attaching, such as laminating, and patterning are described in FIGS. 9A to 9J). The metal foil may be made of copper or a copper alloy; other options include nickel, or an alloy containing an iron-nickel alloy (such as Alloy 42 or Invar™), or aluminum. Preferred foil thickness range is between about 5 and 50 µm, more preferably between 10 and 25 µm, but may be thicker or thinner in other embodiments. Other portions of the patterned metal foil include a plurality of pads 111 for connection to external parts, often using solder bodies 140, and a membrane 112 as a movable part. FIG. 1 depicts membrane 112 extending at least partially across the opening 122, and being parallel to chip 101. Membrane 112 is separated from chip 101 by gap 107, which has a height 107a about 10 to 60 µm, typically about 25 µm. Acceleration is transformed into the displacement of the movable membrane, and the position change is measured as a change of the capacitance relative to the fixed metal layer 108 on chip 101.

Since pads 110 and 111, and membrane 112 are portions of the metal foil attached to substrate surface 120a, they have the same thickness 113; for many embodiments, thickness typically is between 10 and 25 µm. In this thickness range, membrane 112 is flexible in the direction normal to the first substrate surface and movable in the space of the opening 122 and of the gap 107.

Figure 4A:
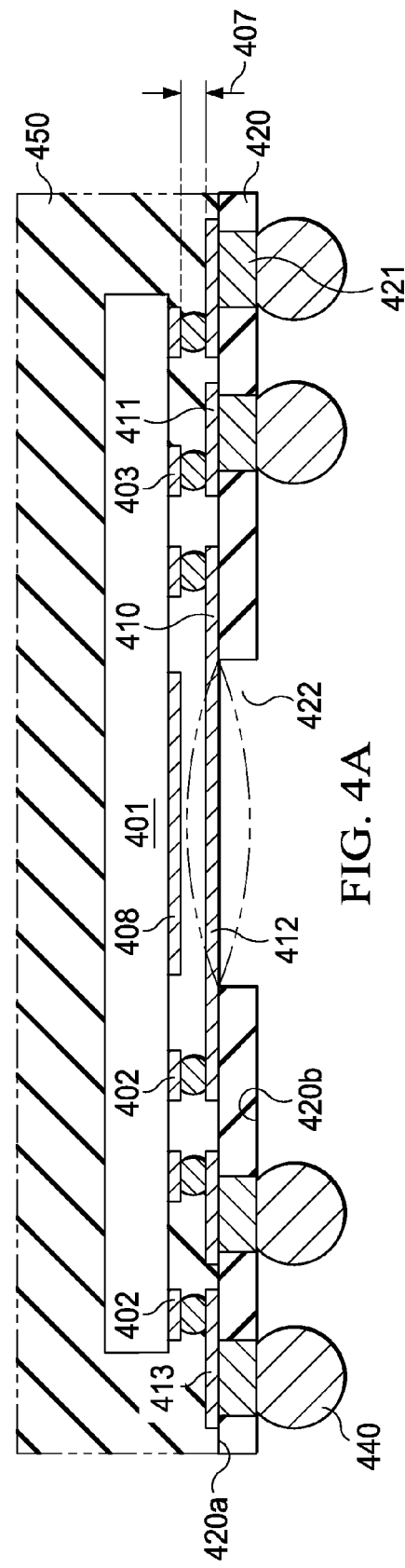
FIG. 4A depicts a schematic cross section of an example MEMS device of the pressure sensor family operating in the capacitive mode, where the movable membrane is part of the substrate-based package. In the example shown, the substrate is an insulating tape; an encapsulation may be added to enhance the package robustness.

The example of FIG. 1 shows a simplified, low cost version, where the opening 122 is not sealed but open; sealed embodiments are illustrated in FIGS. 4A and 5A. In all these embodiments, substrate 120 together with the attached patterned metal foil represent the package for chip 101; membrane 112 as the movable part of the MEMS device is a portion of the package. Examples of the shape of movable part 112 are discussed below in FIGS. 5A to 8.

In the example embodiment of FIG. 2, the MEMS device has a substrate 220 made of a polymeric tape (for instance polyimide), often in the thickness range from about 60 to 100 µm. In this thickness range, substrate 220 is flexible; consequently, in order to have a mechanically robust MEMS device, many applications require the substrate to be strengthened by a body 250 of hardened plastic compound such as polymerized epoxy-based molding compound. The compounds may include inorganic filler particles (such as silicon dioxide or silicon nitride) of about 80 to 90% by volume in order to better match the coefficient of thermal expansion (CTE) of the compound to the CTE of silicon. Since the application of the encapsulation compound 250 is optional, it is shown in dashed outline in FIG. 2.

As FIG. 2 shows, tape 220 has an opening 222 through the thickness of the tape. In FIG. 2, the opening has a uniform width 222a; in other embodiments, the width of the opening may not be constant. In addition, the strengthening body 250 has an opening 252 through the body thickness. Opening 252 feeds into opening 222. Opening 252 may be shaped as a cylinder, a truncated cone wider on the outside and narrowing towards width 222a, as depicted in FIG. 2, or any other suitable stereometrical form. Flip-assembled chip 101 spans at least partially across the opening 222.

The MEMS device of FIG. 2 has, in analogy to the device in FIG. 1, a patterned metallic foil attached to the first surface 220a of the tape 220. An adhesive layer 230 may be used for the attachment (the processes for attaching, such as laminating, and patterning are described in FIGS. 9A to 9J). Typically the metal foil is made of copper or a copper alloy; other options include nickel, or an alloy containing an iron-nickel alloy (such as Alloy 42 or Invar™), or aluminum. The foil thickness range is between about 5 and 50 µm, typically between about 10 and 25 µm, but may be thicker or thinner in other embodiments. The metal foil includes an elongated portion 212, which is operable as a movable part or membrane. Other portions of the patterned metal foil include a plurality of pads 211 for connection to external parts, often using solder bodies 240, and pads 210 for contacts to semiconductor chip 101. FIG. 2 depicts membrane 212 extending at least partially across the opening 222, and being parallel to chip 201. Membrane 212 is separated from chip 201 by gap 207, which has a height 207a of about 10 to 60 µm, typically about 25 µm. Acceleration is transformed into the displacement of the movable membrane, and the position change is measured as a change of the capacitance relative to the fixed metal layer 108 on chip 101.

Since pads 210 and 211, and membrane 212 are portions of the metal foil attached to substrate surface 220a, they have the same thickness 213; for many embodiments, thickness 213 is between about 5 and 50 µm, typically between 10 and 25 µm, but may be thicker or thinner in other embodiments. In this thickness range, membrane 212 is flexible in the direction normal to the first substrate surface and movable in the space of the opening 222 and of the gap 207.

Another example embodiment of the invention, generally designated 300, is illustrated in FIG. 3. The embodiment is a substrate-based MEMS device of the inertial sensor family acting as a capacitive accelerometer with displacement-dependent output signals. Substrate 320 is made of a polymeric tape (for instance polyimide), typically in the thickness range from about 60 to 100 µm, with first surface 320a and opposite second surface 320b [note the difference of surface designations compared to FIGS. 1 and 2]. Tape 320 has a plurality of metal-filled via holes extending from first surface 320a to second surface 320b. One set of vias, designated 311, operates as attachment sites for solder balls 340 to external parts, another set of vias, designated 313, operates as sites for flip-attaching chip 101.

Substrate 320 further has an opening 322 through the thickness of substrate 320, extending from first substrate surface 320a to second substrate surface 320b. In FIG. 3, the opening has a uniform width 322a; in other embodiments, the width of the opening may not be constant. Openings 122 may be shaped as a cylinder, a truncated cone, or any other suitable stereometrical form. Flip-assembled chip 101 spans at least partially across the opening, forming a gap 307 of height 307a with second substrate surface 320b. Height 307a typically is between about 10 and 60 µm, often about 25 µm.

A metal foil 310 is attached onto first substrate surface 320a, typically using an adhesive layer 330 to support the attachment. The metal foil may be made of copper or a copper alloy; other options include nickel, or an alloy containing an iron-nickel alloy (such as Alloy 42 or Invar™), or aluminum. The preferred foil thickness is between 10 and 25 µm, but may be thicker or thinner in other embodiments. The foil is patterned to form a membrane 312 without the adhesive layer. In the foil thickness range indicated, membrane 312 is flexible in the direction normal to the first substrate surface 320a and movable in the space of the opening 322 and of the gap 307. Acceleration is transformed into the displacement of the movable membrane 312, and the position change is measured as a change of the capacitance relative to the fixed metal layer 108 on chip 101.

Since the stack of tape 320, adhesive layer 330, and metal foil 310 has a total thickness in the range from approximately 70 to 150 µm, it is flexible. When some applications require a mechanically more robust MEMS device, the stack may be strengthened by adding a body 350 of hardened plastic compound such as a polymerized epoxy-based molding compound, optionally filled with inorganic particles of silicon dioxide or silicon nitride. The strengthening body 350 has an opening 352 through the body thickness. Opening 352 feeds into opening 322 so that is allows the unobstructed operation of membrane 312 in moving in the z-direction. Opening 352 may be shaped as a cylinder, a truncated cone wider on the outside and narrowing towards width 322a, as depicted in FIG. 3, or any other suitable stereometrical form.

Flip-assembled chip 101 spans at least partially across the opening 322 so that metal plate 108 forms a capacitor with membrane 312. Plate 108 is separated from membrane 312 by a distance, which is composed of the sum of gap height 307a, the thickness of tape 320, and the thickness of adhesive layer 330. As stated above, the movable part, membrane 312, can move in this distance in the z-direction, normal to the plane of the membrane. In some embodiments, movable part 312 includes the suspension beam of length 315 and the movable plate of length 316. Movable plate 316 has an area equal to the area of the fixed plate 108 on the chip surface in order to form a capacitor. In addition, for some embodiments the mass of the movable plate 316 can be enlarged by adding the mass of a deformed gold sphere 314, as formed in the well-known wire ball bond process. Mass 314 represents the proof mass.

The invention allows the selection of the materials and dimensions for opening 322 (and 352), length of suspension beam 315, area of movable plate 316, mass 314, and capacitance between movable plate 316 and fixed plate 108. Consequently, the accelerometer of FIG. 3 can be specialized not only as a capacitive displacement sensing accelerometer, which transforms acceleration into the displacement of a movable mass, but also as a force sensing accelerometer, which detects directly the force applied on a proof mass. The mechanical transfer function of the selected components relates applied acceleration as the input to the displacement of the mass (movable plate 312 and mass 314) as the output. The components of FIG. 3 allow a designed distribution of the output between the additive forces: inertial force, elastic force, and damping force.

The example embodiments shown in FIGS. 4A, 5A, 6, 7, and 8 illustrate MEMS device with enclosures, which are quasi-hermetic in polymeric packages, and fully hermetic in packages using ceramic or glassy encapsulations. The embodiment of FIG. 4A displays a QFN/SON-type MEMS device, generally designated 400, of the pressure sensor family, which operates in the capacitive mode with displacement-dependent output signals. An integrated circuit chip 401 is flip-assembled onto metallic pads on the surface of a substrate 420. The substrate may be a multi-metal layer insulating composite, as discussed above in FIG. 1, or a polymeric sheet, as discussed in FIG. 2, or a polymeric sheet with metal-filled via holes, as discussed in FIG. 3. Substrate 420 in FIG. 4A illustrates the latter embodiment. The metal-filled vias are designated 421. The use of solder balls 440 for interconnection makes these devices especially suitable for high input-output counts, multi-chip modules and package-on-package modules.

Substrate 420 has an opening 422 through the thickness of the substrate, extending from first substrate surface 420a to second substrate surface 420b. In FIG. 4A, the opening has a uniform width; in other embodiments, the width of the opening may not be constant. The openings may be shaped as a cylinder, a truncated cone, or any other suitable stereometrical form. The flip-assembled chip 401 spans at least partially across the opening, forming a gap 407 with first substrate surface 420a. The gap has a typical height between about 10 and 60 µm, more typically about 25 µm.

Substrate 420 has a patterned metal foil attached to its first substrate 420a; an optional adhesive attachment layer is not shown in FIG. 4A. The foil typically is made of metal such as copper or nickel, alternatively of an iron-nickel alloy (such as Alloy 42 or Invar™) or of aluminum. For many embodiments, the thickness is between about 5 and 50 μm, preferably between about 10 and 25 μm, but may be thicker or thinner in other embodiments. The pattern of the foil includes at least one movable part and a plurality of pads; in general, the pattern allows complicated routings of signals. In the thickness range quoted, the movable part 412 can act as a membrane, which is flexible in the z-direction, movable in the space of the opening 422 and of the gap 407. As a membrane, part 412 is sensitive to external pressure changes arriving from z-direction through opening 422, bending the membrane inward and outward of gap 407. In some embodiments, movable part 412 has an area between about 0.5 and 2.3 mm$^2$; in other embodiments, the area may be smaller or larger. In some MEMS devices, the membrane may be divided in a movable plate 412a and suspension beams 412b, which hold the plate. Plate 412a may have a rectangular or a rounded outline; an example is illustrated in the top view of FIG. 4B. The suspension beams 412b may take a wide variety of configurations (angular, spring-like, rounded, etc.) to enhance the pressure sensitivity; FIG. 4B depicts an angular configuration. The movable membrane 412 is facing metal plate 408 on chip 401 to form a capacitor across gap 407.

For the example embodiment of FIG. 4A, the plurality of pads may be grouped in sets. The pads of the first set, designated 410, enable electrical interconnection between the movable part 412 and the integrated circuit of chip 401. The leads of the second set, designated 413, enable contacts to external parts; they allow the attachment of solder balls 440. The leads of the third set, designated 411, are configured as a metal seal ring encircling the opening 422. In general, patterning of the foil enables high density interconnects as well as complicated routing of signals.

For the substrate pad sets 410 and 413, a plurality of chip terminals 402 allow the connections to solder bodies, gold bumps, or gold alloy. The gold bumps may be produced by a wire ball bonding technique, followed by a flattening process with a coining technique. The gold alloy may be a low melting gold/germanium eutectic with 12.5 weight % Ge and an eutectic temperature of 361° C. In addition, chip terminal 403 may be configured as a seal ring to allow the formation of a seal ring made of solder or gold alloy to seal the enclosed space at least quasi-hermetically, e.g. against environmental disturbances such as particles, but not completely against gaseous and moisture molecules. FIG. 4A shows the optional encapsulation 450 material filling the space between the chip 401 and substrate 420 up to the seal ring between pad 411 and chip terminal 403. The encapsulation 450 typically is fabricated by a molding technique (for instance transfer molding) using an epoxy-based molding compound; the compound is hardened by polymerization to give mechanical strength to device 400. The compound may include inorganic filler particles (such as silicon dioxide or silicon nitride) of about 80 to 90 volume % in order to lower the coefficient of thermal expansion (CTE) close to the silicon CTE.

Sensing plate 408 and membrane 412, typically having the same area and being separated by a gap, form a capacitor. As stated above, membrane 412 is made of a metal (for example, copper) thin enough (for example, 10 μm) to be flexible and sensitive to pressure changes. The assembled device 400, therefore, works as a MEMS device for pressure sensor and microphone. Responding to pressure arriving through opening 422 by bending inward and outward, membrane 412 modifies distance 407 relative to stationary plate 408. Let the area of membrane 412, and plate 408, as electrodes be A; the distance between the electrodes under original pressure be $D_o$; and the dielectric constant of the space between the electrodes be $\in$, then the capacitance C of the electrodes is given by $$C = \in \cdot A/D_o.$$

Pressure in z-direction deforms the flexible membrane so that the deformed area has to be calculated as an integral over small area elements dx·dy, while the distance $D_o$ is modified in both x-direction and y-direction by a deflection $w_{x,y}$. The resulting change of capacitance is measured by the circuitry of chip 401, operating as a microphone or a pressure sensor. A miniature speaker can be built in a similar way by driving the membrane electrostatically.

It should be stressed that the embodiments shown in FIGS. 1, 2, 3, and 4A lend themselves to stacking of devices; these stacked devices include multi-chip MEMS devices as well as package-on-package MEMS devices.

In order to give a cost estimate for the example pressure sensor MEMS device, the side lengths of the molded material 450 in FIG. 4A may be 3 by 3 mm, 4 by 4 mm, 3 by 4 mm, or any other size desired by customers. The base material of the substrate may be polyimide, and the metal foil, including the membrane 412, may be copper. The cost of the molded package, including the movable part, in mass production is about $0.13. With the added cost of the chip about $0.009, the total cost of the MEMS device in a plastic package including the movable part according to the invention is about $0.139. This cost compares to the cost of a conventional pressure sensor MEMS device of the same body sizes and a FR-4 based substrate material as follows: The cost of the conventional package is about $0.54; the cost of the chip including the movable part is about $0.017; the total cost of the MEMS device about $0.557. This cost is approximately four-fold the cost of the MEMS device according to the invention.

Figure 5B:
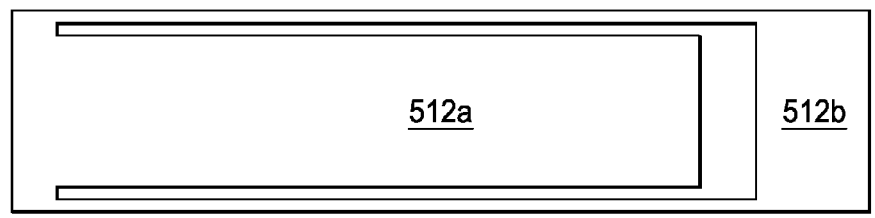
FIG. 5B is a schematic top view of a membrane for the MEMS device in FIG. 5A including lateral sensing.

FIGS. 5A to 5D illustrate a MEMS device embodiment as a variable capacitor and RF switch, with the possibility for a fully hermetic package, suitable for cellular handset antenna tuning. The construction of the example MEMS device in FIG. 5A is similar to the device described in FIG. 1 with the following additions. The opening 522 of substrate 520 (shown as a multi-level metal insulating compound or ceramic) is sealed by a lid 550 in flat contact with substrate 520. The lid material may be plastic for quasi-hermetic sealing, or, if fully hermetic sealing is needed for a ceramic substrate, a moisture-impenetrable material such as glass, ceramic, or, in some devices, metal. Substrate pad 511 and contact 503 of chip 501 are configured as a seal rings to allow complete sealing by solder or a low-melting gold alloy. Membrane 512 as the movable part extends at least partially across opening 522. Membrane 512 is shown in FIG. 5A as membrane-at-rest in solid contour, and as deflected membrane in dashed contour. When deflected, the membrane rests on dielectric film 508a attached to chip plate 508. In this position, the membrane forms a high capacitance with the plate, representing a low impedance for RF frequencies; the RF switch is turned on.

The concept to integrate the movable part of a MEMS device with a substrate-based package rather than with the chip allows numerous variations with the goal to sensitize certain aspects of the measurement, or to include new aspects into the measurement. FIGS. 5B, 5C, 5D, 6, 7, and 8 highlight only a few select variations and possibilities and are not intended to be construed in a limiting sense. The figures should emphasize the great number of possibilities of the invention apparent to persons skilled in the art.

Figure 5C:
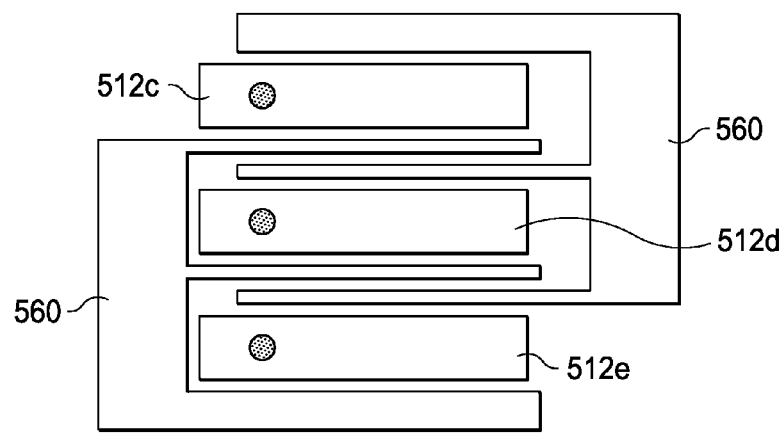
FIG. 5C is a schematic top view of a fingered membrane for the MEMS device in FIG. 5A to increase the sensitivity for lateral movement.
Figure 5D:
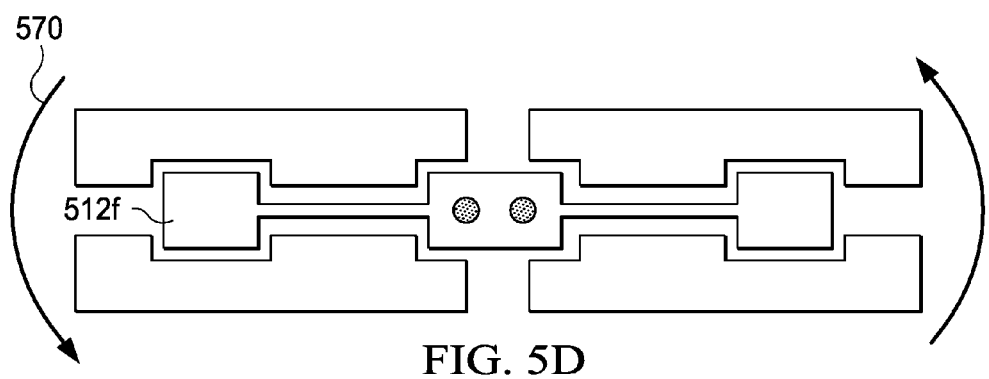
FIG. 5D is a schematic top view of a symmetrically balanced membrane for the MEMS device in FIG. 5A for sensing rotational acceleration.

FIGS. 5B, 5C. and 5D show some examples of membrane configurations in leaf spring patterns in order to reduce electrostatic force requirements, or to add lateral movement sensitivity. In FIG. 5B, the membrane is divided into a moving portion 512a and a fixed portion 512b; the design helps to minimize the risk of membrane sticking to the plate on the chip. In FIG. 5C, the design of fingered membranes 512c, 512d, and 512e surrounded by fixed metal portions 560 increases lateral motion and the sensitivity to lateral movements of the membrane; the lateral movement is detected by capacitance measurement). FIG. 5D shows that the enhanced designs can also be made both fingered and balanced. The lateral sensing electrodes 512f are symmetrically arranged for sensing rotational acceleration (indicated by arrows 570). The quoted structures may adjust proof mass, for instance by adding squashed balls from wire bonding, see FIG. 3), and spring constant so that they can be tuned for different applications.

Figure 6:
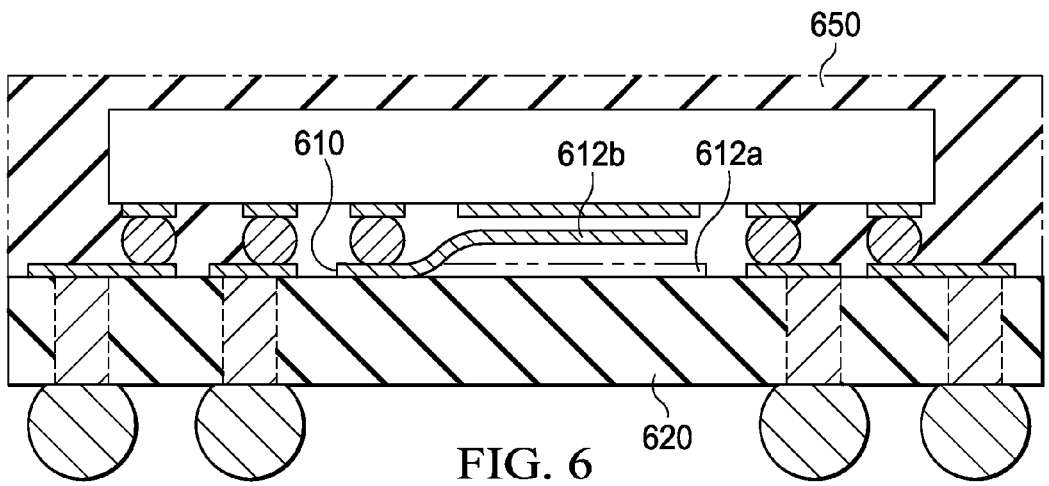
FIG. 6 shows a schematic cross section of a hermetic MEMS device accelerometer, where the electrostatically lifted proof mass is part of the substrate-based package.
Figure 7:
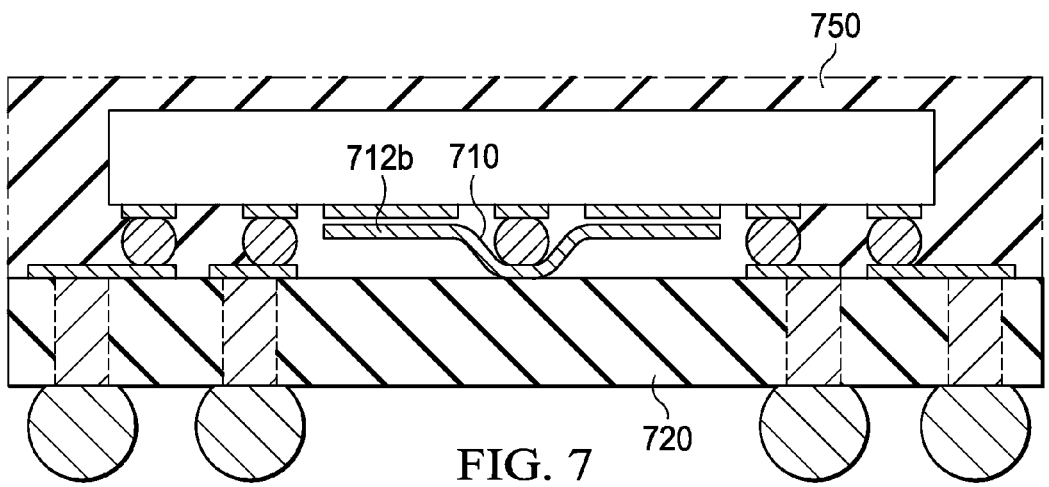
FIG. 7 depicts a schematic cross section of a hermetic MEMS device accelerometer with a symmetrically balanced proof mass.
Figure 8:
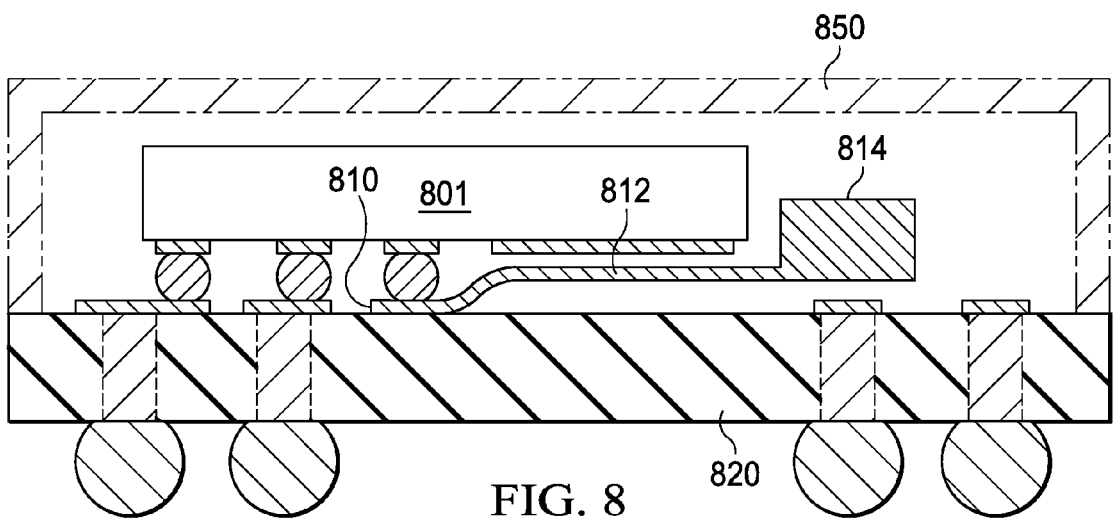
FIG. 8 illustrates a schematic cross section of a hermetic MEMS device accelerometer with a semiconductor chip attached on only one side to allow an enlarged proof mass sensor.

FIGS. 6, 7, and 8 show additional examples of MEMS device accelerometers to illustrate the variety of design options for devices with single member membranes integrated into substrate-based (620, 720, 820) packages with attached metal foil (610, 710, 810). The MEMS devices are encapsulated by molding compound (650, 750) in FIGS. 6 and 7, or by a can-type housing (850) in FIG. 8. The single member membrane design is depicted in FIG. 6 in zero position (612a) and activated (hovering) position (612b). By lifting the proof mass from the substrate surface using electrostatic force from the plate on the chip above the substrate, the lateral electrodes can also be made to electrostatically hover to detect vertical motion by restoring force signals; the force needed to keep the proof mass in place is proportional to the acceleration. Hovering membranes may be passivated when they are made of a corrosive metal such as copper.

The symmetrically balanced design of a single membrane is shown in FIG. 7 in activated (hovering) position (712b). As stated above, the addition of lateral sensing electrodes allows the sensing of lateral movements of the membrane by capacitance measurements.

FIG. 8 illustrates a MEMS device with mounting chip 801 on one side only so that the smaller chip allows a membrane 812 with a sensor enlarged by proof mass 814. The sensitivity of the accelerometer is enhanced compared to the arrangement discussed in FIG. 6. In general, MEMS devices with the movable element integrated into substrate packages such as shown in FIGS. 5A, 6, 7, and 8 lend themselves to multi-chip and stacked package-on-package applications.

Another embodiment of the invention is a process for fabricating substrate based MEMS devices with the movable element integrated into the device packages. For the process flow shown in FIGS. 9A to 9J, the process starts in FIG. 9A by selecting a flat substrate 920. The substrate may be a sheet or board of a multi-metal layer plastic composite, a multi-metal layer ceramic composite, or a glass-fiber strengthened board such as FR-4, with an example thickness between 70 and 150 µm. Alternatively, substrate 920 may be a polymeric tape such as a polyimide-based tape. The substrate has a first surface 920a and an opposite second surface 920b. In the next process step, openings 922 are formed through the thickness of the substrate, from the first to the second surface. One method of forming the openings is a punching technique.

Figure 9A:
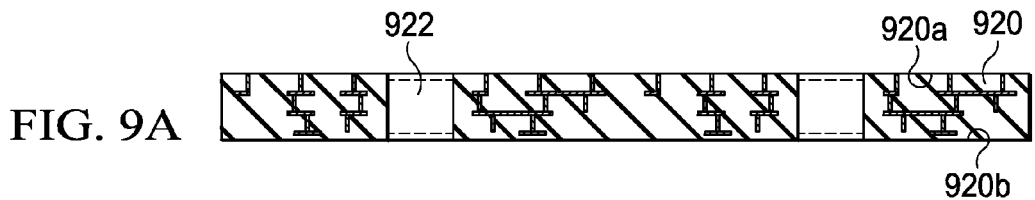
FIGS. 9A to 9J illustrate certain process steps of a fabrication flow for an inertial sensor MEMS device with the movable membrane integrated into the substrate-based package.
Figure 9B:
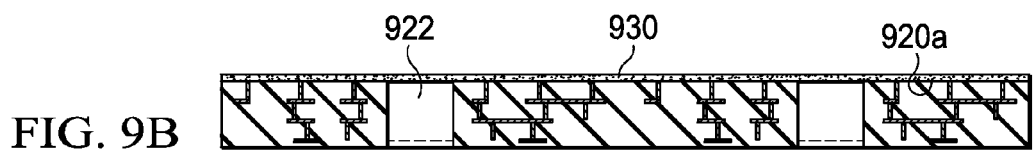
Figure 9C:
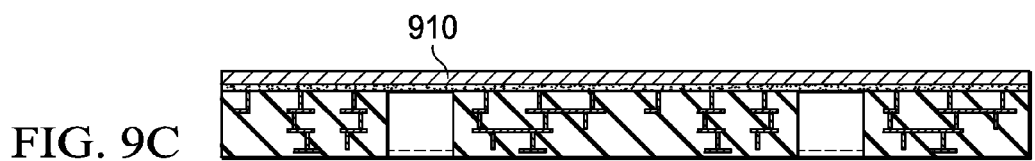

In FIG. 9B, a layer 930 of an adhesive material is attached to the substrate across the first surface 920a, including across the openings 922. The adhesive material is selected to stick to the substrate as well as to metal. In FIG. 9C, a metal foil 910 is laminated across the adhesive layer on the first substrate surface. Suitable metals include copper, nickel, and aluminum, and the thickness range typically is from about 10 to 25 µm, more generally from about 5 to 50 µm. The thickness of the metal foil is selected so that the metal has the flexibility to operate as the membrane of the MEMS device.

Figure 9D:
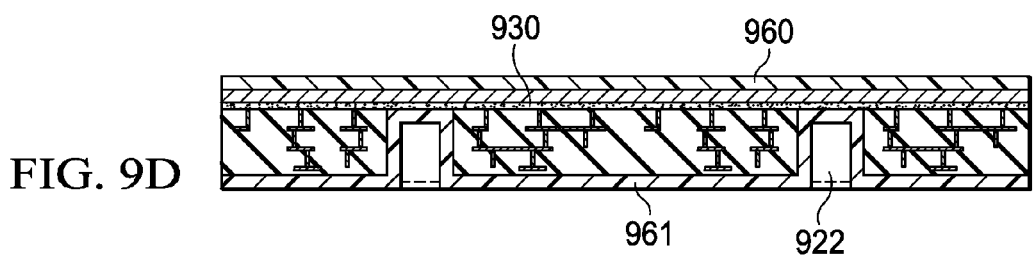

The patterning of metal layer 910 into a plurality of pads and a segment-to-become-membrane begins with depositing a photoresist layer 960 across the metal foil on the flat first substrate surface and another photoresist layer 961 across the contoured second substrate surface. As FIG. 9D shows, photoresist layer 961 follows the outline of the openings 922, where it also adheres to adhesive layer 930. While photoresist layer 960 is masked, developed, and etched, photoresist layer 961 remains unaffected. When metal layer 910 is etched and patterned, photoresist layer 961 protects substrate surface 920b. Finally, when photoresist layer 960 is removed, photoresist layer 961 is also removed, and with it the portions of adhesive film 930, onto which photoresist layer 961 had adhered.

Figure 9E:
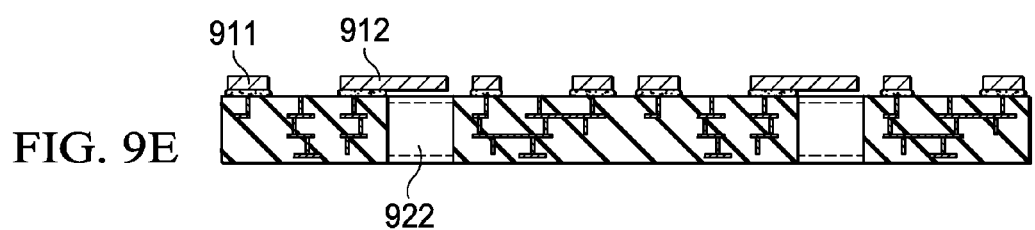

The result of the patterning steps for metal layer 910 is illustrated in FIG. 9E. The patterning created segment 912, which is to become the moving part of the MEMS device, for instance the membrane, and the plurality of pads 911. As membrane, segment 912 extends at least partially across opening 922. As a further result, the patterning of metal foil 910 creates interconnecting traces not shown in FIG. 9E.

Figure 9F:
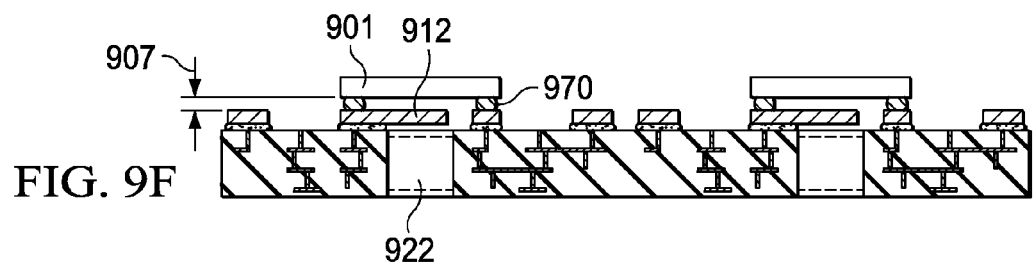

In the step depicted in FIG. 9F, a semiconductor chip 901 with electronic circuitry is flip-connected onto some of the metal pads so that the chip extends at least partially across membrane 912 and opening 922. The chip attachment is facilitated by bumps 970 made of solder or of gold. After the chip attachment, a gap 907 is formed between chip 901 and membrane 912. Gap 907 is mostly determined by the height of bumps 970.

Figure 9G:
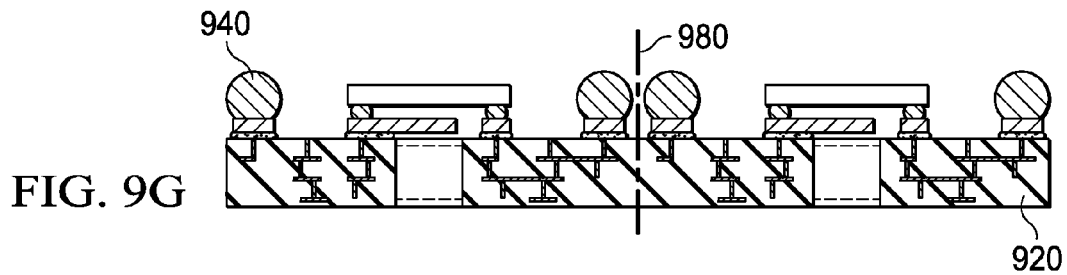
Figure 9H:
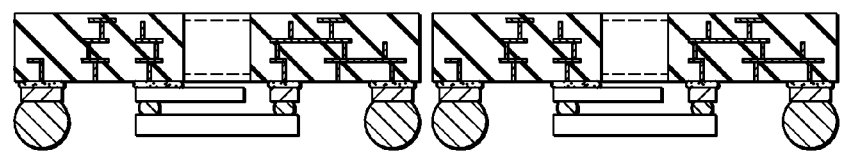

In the next process step, illustrated in FIG. 9G, connecting metal bodies 940, such as solder balls, solder paste, or bodies of a low-melting gold alloy, are attached to a plurality of pads 911. Next, substrate 920 is prepared for the cuts along line 980, for instance by a saw, to singulate the substrate into discrete MEMS devices. These separated units are depicted in FIG. 9H; each unit is an example MEMS device as described in FIG. 1.

Figure 9I:
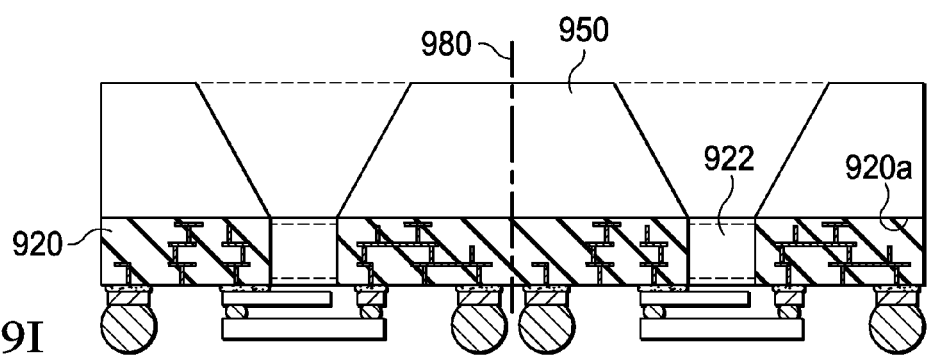

Alternatively, before the cuts along line 980 in FIG. 9G are administered, the process step shown in FIG. 9I may be performed. The un-singulated substrate with the assembled chips is transformed into a more robust configuration by an encapsulation technology. In one process embodiment, the substrate with the assembled chips and the solder balls attached is loaded into a mold for a transfer molding process. The encapsulation material 950 is deposited over the features on substrate side 920a so that cavity 922 remains open, or may, in some MEMS devices, actually widen, as suggested in FIG. 9I. The encapsulation process may be a transfer molding technique, and the encapsulation material may be an epoxy-based polymeric molding compound selected so that the compound adheres strongly to substrate 920. As stated above, steel hillocks protruding into the mold cavity used for transfer molding technology offer a low cost way to prevent a filling of opening 822 with compound. After the molding step, the polymeric compound 950 is hardened by polymerization, resulting in a sturdy package for the MEMS device.

Figure 9J:
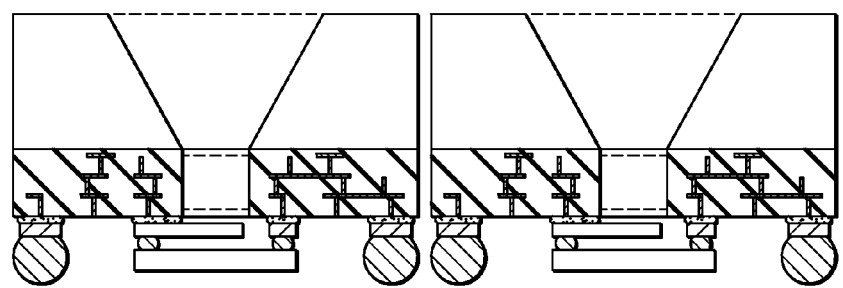

Next, substrate 920 is prepared for the cuts along line 980, for instance by a saw, to singulate the substrate into discrete MEMS devices. These separated units are depicted in FIG. 9J; each unit is similar to the example MEMS device described in FIG. 2.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to any material for the MEMS device package, including plastics and ceramics, and the semiconductor device, integrated circuits as well as discrete devices, including silicon, silicon germanium, gallium arsenide, or any other semiconductor or compound material used in manufacturing.

As another example, the integration of the movable element into the leadframe-based package of a MEMS device can be applied to piezoresistive pressure sensors, where the conversion of pressure to an electronically detectable signal relies on the elastic deformation of a membrane, or generally of a structure, that is exposed to the pressure.

As another example, the integration of the movable element into the leadframe-based package of a MEMS device can be applied to resonant pressure sensors, where the resonance frequency depends on the mechanical stress in the vibrating microstructure.

As another example, the method of integrating the movable element into the MEMS device package allows an inexpensive fine-tuning of the mechanical transfer function by controlling the thickness of the membrane and by adding one or more mass units of squashed balls produced in wire bonding technique.

As another example, the integration of the movable element into the substrate-based package of a MEMS device can be applied to piezoresistive pressure sensors, where the conversion of pressure to an electronically detectable signal relies on the elastic deformation of a membrane, or generally of a structure, that is exposed to the pressure.

As another example, the integration of the movable element into the substrate-based package of a MEMS device can be applied to resonant pressure sensors, where the resonance frequency depends on the mechanical stress in the vibrating microstructure.

As another example, the method of integrating the movable element into the substrate-based MEMS device package allows an inexpensive fine-tuning of the mechanical transfer function by controlling the thickness of the membrane and by adding one or more mass units of squashed balls produced in wire bonding technique.

It is therefore intended that the appended claims encompass any such modifications or embodiments.

What is claimed is:

1. A MEMS device, comprising:
a substrate having an opening extending between upper and lower surfaces;
a first metal layer formed over the lower surface, the first metal layer defining a deflectable membrane and a pad, with the membrane extending at least partially across the opening; and
an integrated circuit chip having an upper surface attached peripherally over the opening, through the membrane and pad to the lower surface of the substrate;
wherein the integrated circuit chip has the upper surface separated from an extending portion of the membrane by a gap and includes a second metal layer forming a fixed plate configured so that deflection of the extending portion of the membrane relative to the fixed plate can be measured as a change in capacitance.

2. The device of claim 1, wherein the integrated circuit chip is attached by solder to the membrane and pad.

3. The device of claim 2, wherein the first metal layer further defines a plurality of further pads laterally spaced outwardly from the membrane and pad, and the further pads are configured for connection of the device to external parts using solder bodies.

4. The device of claim 3, wherein the first metal layer comprises a patterned metal foil attached by adhesive to the lower surface of the substrate.

5. The device of claim 4, wherein the metal foil comprises at least one of copper, copper alloy, nickel, an iron-nickel alloy, or aluminum.

6. The device of claim 5, further comprising a tape formed over the lower surface of the substrate; and wherein the metal foil is attached by the adhesive to the tape.

7. The device of claim 6, wherein the opening is an upwardly and outwardly tapered opening.

8. The device of claim 7, wherein the membrane is attached at one end to the tape, and is left unattached at another end.

9. The device of claim 1, wherein the first metal layer further defines a plurality of further pads laterally spaced outwardly from the membrane and pad, and the further pads are configured for connection of the device to external parts using solder bodies.

10. The device of claim 1, wherein the first metal layer comprises a patterned metal foil attached by adhesive to the lower surface of the substrate.

11. The device of claim 10, wherein the metal foil comprises at least one of copper, copper alloy, nickel, an iron-nickel alloy, or aluminum.

12. The device of claim 1, further comprising a tape formed over the lower surface of the substrate; and wherein the first metal layer comprises a patterned metal foil attached by the adhesive to the tape.

13. The device of claim 12, wherein the membrane is attached at one end to the tape, and is left unattached at another end.

14. The device of claim 1, wherein the opening is an upwardly and outwardly tapered opening.

15. A MEMS device, comprising:
a substrate formed with an opening through the substrate from a first surface to an opposite second surface generally coplanar with the first surface;
a metal foil layer adhered over the substrate first surface and patterned into a plurality of pads and a segment extending at least partially across the opening; and
a semiconductor chip having electronic circuitry, the chip being flip-connected onto the pads so that the chip spans at least partially across the opening, separated from the segment by a gap.

16. The device of claim 15 further including a polymeric compound deposited and hardened over the device, preserving the opening in the substrate.

* * * * *